US012772833B2

(12) United States Patent
Cheng

(10) Patent No.: US 12,772,833 B2
(45) Date of Patent: Oct. 20, 2026

(54) SEMICONDUCTOR DEVICE AND METHOD OF FORMING THE SAME

(71) Applicant: Taiwan Semiconductor Manufacturing Company, Ltd., Hsinchu (TW)

(72) Inventor: Yung-Shih Cheng, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 371 days.

(21) Appl. No.: 18/481,244

(22) Filed: Oct. 5, 2023

(65) Prior Publication Data

US 2025/0118665 A1 Apr. 10, 2025

(51) Int. Cl.

| | |
|---|---|
| ***H10W 20/41*** | (2026.01) |
| ***H10W 20/42*** | (2026.01) |
| ***H10W 42/00*** | (2026.01) |
| ***H10W 90/00*** | (2026.01) |

(52) U.S. Cl.

CPC ......... *H10W 20/435* (2026.01); *H10W 20/42* (2026.01); *H10W 42/00* (2026.01); *H10W 90/00* (2026.01)

(58) Field of Classification Search

None

See application file for complete search history.

(56) References Cited

U.S. PATENT DOCUMENTS

| | | | | |
|---|---|---|---|---|
| 9,209,247 | B2 | 12/2015 | Colinge et al. | |
| 9,236,267 | B2 | 1/2016 | De et al. | |
| 9,412,817 | B2 | 8/2016 | Yang et al. | |
| 9,412,828 | B2 | 8/2016 | Ching et al. | |
| 9,472,618 | B2 | 10/2016 | Oxland | |
| 9,502,265 | B1 | 11/2016 | Jiang et al. | |
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 2023/0154870 | A1* | 5/2023 | Chen .................... | H10W 42/00 257/584 |
| 2025/0038074 | A1* | 1/2025 | Hsiao .................... | H10W 20/20 |

* cited by examiner

*Primary Examiner* — Anthony Ho
(74) *Attorney, Agent, or Firm* — JCIPRNET

(57) ABSTRACT

Provided are a semiconductor device and a method of forming the same. The semiconductor device includes a device layer having a frontside and a backside; a first interconnect structure disposed on the frontside of the device layer, and having a first seal ring structure; a second interconnect structure disposed on the backside of the device layer; and a diode and a transistor embedded in the device layer, wherein a gate of the transistor is electrically connected to the first seal ring structure by the diode.

20 Claims, 7 Drawing Sheets

1

SEMICONDUCTOR DEVICE AND METHOD OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
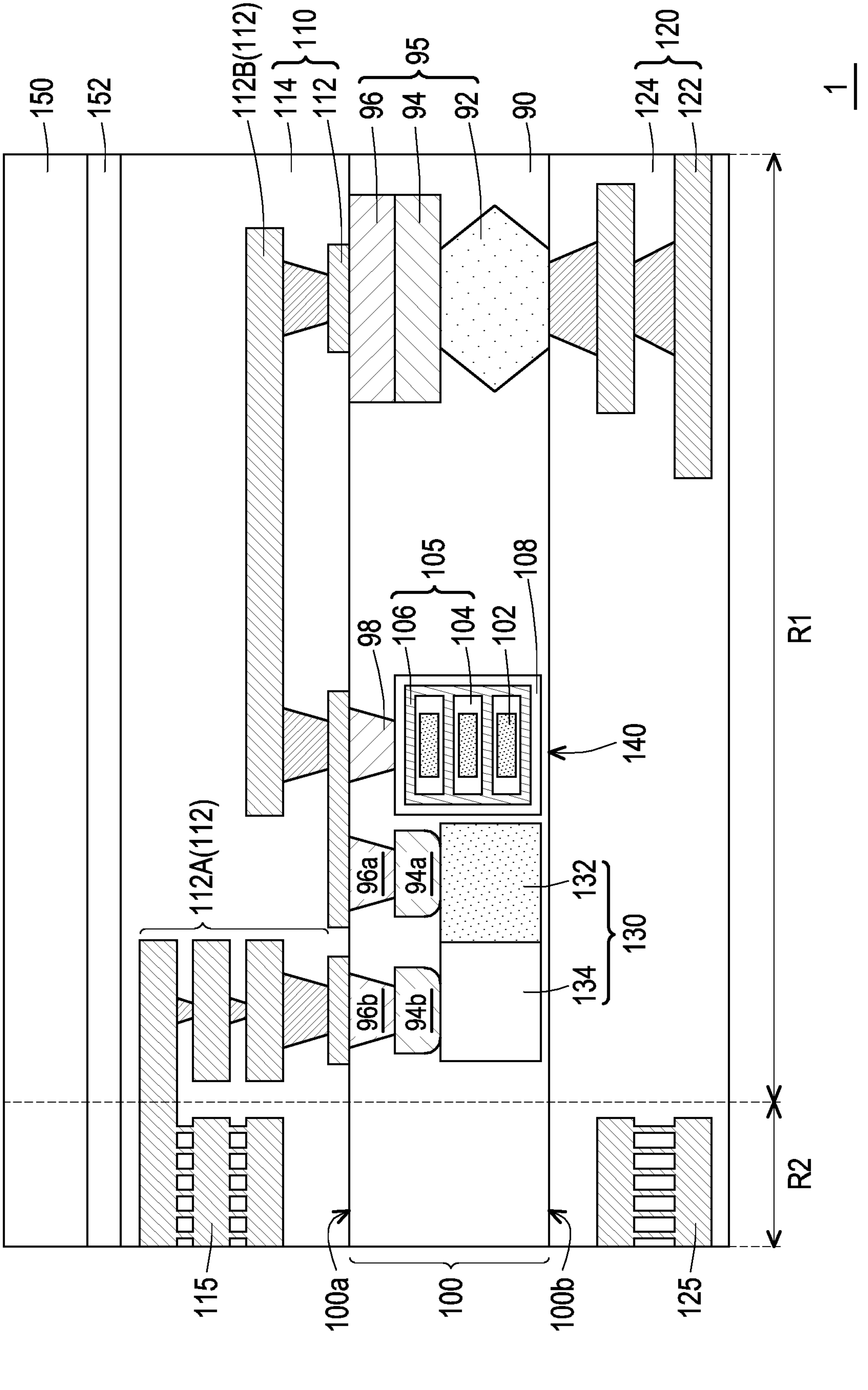
FIG. 1 is a cross-sectional view showing a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

As integrated circuit (IC) technologies progress towards smaller technology nodes, some routing structures have been moved from the front side of the device structures to the back side of the device structures. For example, backside power rails (BPR) or super power rails (SPR) have been proposed where a backside source/drain contact is formed through the substrate to come in contact with a source/drain feature and a power rail is formed on the backside of the substrate to be in contact with the backside source/drain contact. The formation of the backside source/drain contact is not without its challenges. For example, plasma etching or plasma deposition processes utilize an electrically charged plasma, which can deposit static electrical charge onto the semiconductor wafer. If this static electrical charge discharges through a gate oxide of a field effect transistor (FET), then this can damage or destroy the FET. This phenomenon is sometimes referred to as plasma-induced damage (PID).

Process charge damage to circuit components is a substantial concern during IC fabrication, and the fabrication process should be designed to avoid process charge damage to sensitive components, especially the thin gate oxide of FETs. One common mechanism of process charge damage is PID channeled from an area of metallization through a FET gate. In this damage modality, the area of metallization serves as an inadvertent metal antenna to collect static electrical charge. When that metal area is electrically connected to a FET gate, for example during formation of a via connecting the metal to the gate contact, then the static charge on the metal can discharge through the gate, thus damaging or destroying the gate and hence the corresponding FET.

The present disclosure provides a semiconductor device and a method of forming the same in which the transistor has the gate electrically connected to the seal ring structure by the diode, while the backside conductive feature is electrically connected to the gate of the transistor. In such embodiment. process charge that is produced during fabrication of the backside interconnect structure can be collect in the seal ring structure formed in the frontside interconnect structure. In this case, the seal ring structure may be referred to as the charge pool, so that the process charge during fabrication of the backside interconnect structure can be released into the charge pool to avoid the PID effect and further protect the gate of the transistor from damaging or destroying, thereby maintaining the resistance of the channel. In addition, during the operation, the diodes may be referred to as a switch to avoid the gates of the transistors in the array being electrical short through the common seal ring structure.

Some embodiments discussed herein are described in the context of a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanosheet channel(s), bar-shaped channel(s), and/or other suitable channel configuration. Presented herein are embodiments of devices that may have one or more channel regions (e.g., nanosheets) associated with a single, contiguous gate structure. However, one of ordinary skill would recognize that the teaching can apply to a single channel (e.g., single nanosheets) or any number of channels. One of ordinary skill may recognize other examples of semiconductor devices that may benefit from aspects of the present disclosure. Further, various embodiments may be applied to whole wafers or dies including other types of transistors (e.g., fin field-effect transistors (FinFETs), planar transistors, or the like) in lieu of or in combination with the GAA devices.

FIG. 1 is a cross-sectional view showing a semiconductor device in accordance with some embodiments.

Referring to FIG. 1, a semiconductor device 1 may include a device layer 100, a first interconnect structure 110, and a second interconnect structure 120. In some embodiments, the device layer 100 has a frontside 100*a* and a backside 100*b* opposite to each other. The first interconnect structure 110 may be disposed on the frontside 100*a* of the device layer 100, which may be referred to as the frontside interconnect structure. In some embodiments, the first interconnect structure 110 includes a first dielectric layer 114 and a first conductive feature 112 embedded in the first dielectric layer 114. The first conductive feature 112 may include a plurality of conductive lines and a plurality of conductive vias interconnecting the layers of conductive lines. On the other hand, the second interconnect structure 120 may be disposed on the backside 100*b* of the device layer 100, which may be referred to as the backside interconnect structure. In some embodiments, the second interconnect structure 120 includes a second dielectric layer 124 and a second conductive feature 122 embedded in the second dielectric layer 124. The second conductive feature 122 may include a plurality of conductive lines and a plurality of conductive vias interconnecting the layers of conductive lines.

In some embodiments, the semiconductor device 1 further includes a diode 130 and a transistor 140 embedded in the device layer 100. Specifically, the diode 130 may include a first doped region 132 with a first conductivity type and a second doped region 134 with a second conductivity type connected to each other. The first conductivity type is different from the second conductivity type. For example, when the first doped region 132 is a N-type doped region, the second doped region 134 is a P-type doped region, vice versa. In some embodiments, the diode 130 is a diode with a PN junction, such as a P+/N-well diode, and an N+/P-well diode, an N-well/P-well diode, or one having any other type of junction. The processes of forming the P-well and forming the N-well may include one or more of plasma implantation, diffusion, or epitaxial growth, and providing a semiconductor body with some initial doping type.

In some embodiments, the transistor 140 includes a pair of epitaxial source/drain regions (not shown in this cross-sectional view) and a gate structure 105 disposed between the pair of epitaxial source/drain regions. Specifically, the gate structure 105 may include a gate dielectric layer 104 wrapping a plurality of nano structures 102 stacked alternately, and a gate electrode 106 formed on the gate dielectric layer 104. As shown in FIG. 1, the stacked nano structures 102 may be nanowires, nanosheet, or the like stacked alternately, which maybe referred to as the channels of the nano-FET. However, the embodiment of the disclosure is not limited thereto, in other embodiments, the device layer 100 may have different types of transistors (e.g., planar FETs, finFETs, thin film transistors (TFTs), or the like). In addition, the transistor 140 further includes an insulating spacer 108 wrapping the gate structure 105.

The device layer 100 further includes a conductive path 95 extending from the frontside 100*a* of the device layer 100 to the backside 100*b* of the device layer 100. In detail, the conductive path 95 may include an epitaxial layer 92, a metal-to-diffusion (MD) layer 94, and a conductive via-to-diffusion (VD) layer 96 embedded in a dielectric layer 90. In some embodiments, the MD layer 94 is disposed between the epitaxial layer 92 and the VD layer 96. The epitaxial layer 92 may be in contact with the second conductive feature 122 of the second interconnect structure 120 at the backside 100*b*, and the VD layer 96 is in contact with the first conductive feature 112 of the first interconnect structure 110 at the frontside 100*a*.

Figure 2:
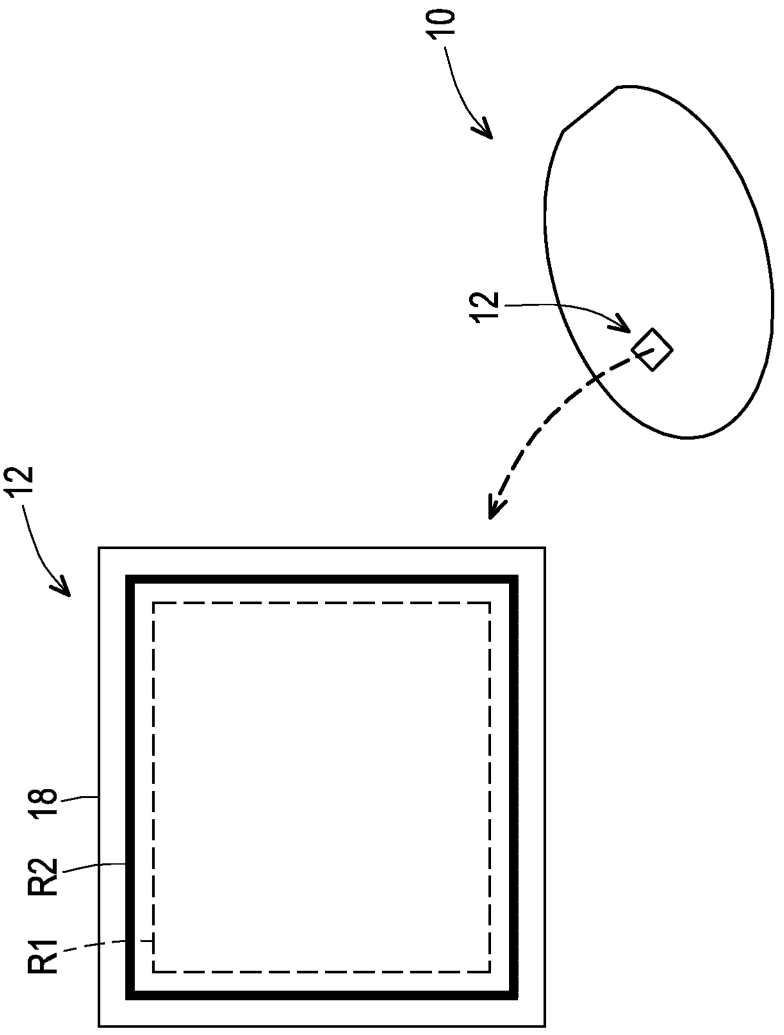
FIG. 2 is a plan view showing a wafer having a die fabricated thereon and an enlarged view of the die.

In addition, the semiconductor device 1 may include a first region R1 and a second region R2. In the cross-sectional view of FIG. 1, the first region R1 is adjacent to the second region R2. In the plan view of FIG. 2, the second region R2 laterally surrounds the first region R1 along a closed path from a plan view the device layer 100. Specifically, a semiconductor wafer 10 is shown, which may for example be a silicon wafer, a silicon-on-insulator (SOI) wafer, or so forth. An illustrative integrated circuit (IC) die 12 (also referred to herein as an IC 12 or as a die 12) is formed on and/or in the semiconductor wafer 10. While a single die 12 is shown, more typically a two-dimensional (e.g., square or rectangular) array of dice are formed on the semiconductor wafer. Moreover, the illustrative IC die 12 may be an IC under fabrication. In addition, the enlarged view of the IC die 12 illustrates the first region R1 and the second region R2 laterally surrounding the first region R1. In the embodiment, the first region R1 is a device region in which functional circuit components are fabricated, hereinafter called "device region R1", and the second region R2 is a seal ring region encircling the device region R1, hereinafter called "seal ring region R2". The semiconductor wafer 10 further includes a street-line 18 outside the device region R1 and outside the seal ring region R2. The circuit components are formed in the device region R1 in the FEOL processing and are interconnected during the BEOL processing to form a functional IC such as a microprocessor, electronic memory chip, image sensor, or other type of IC. The seal ring region R2 serves a protective role for protecting the device region R1 from ingress of particulates or other contaminants. The street-line 18 corresponds to a dicing line along which the semiconductor wafer 10 is cut by a laser saw or the like to separate the IC die 12 after completion of the IC fabrication process.

Referring back to FIG. 1, a first seal ring structure 115 is located in the seal ring region R2 to laterally surround the diode 130 and the transistor 140 in the device region R1. That is, the first seal ring structure 115 may laterally surround the diode 130 and the transistor 140 in the device region R1 along a closed path from a plan view the device layer 100. In some embodiments, the gate structure 105 of the transistor 140 may be electrically connected to the first seal ring structure 115 by the diode 130. Specifically, the first doped region 132 of the diode 130 may be electrically connected to the gate structure 105 by a MD layer 94*a*, a VD layer 96*a*, the first conductive feature 112, and a conductive via-to-gate (VG) layer 98, while the second doped region 134 of the diode 130 may be electrically connected to the first seal ring structure 115 by a MD layer 94*b*, a VD layer 96*b*, and the first conductive feature 112. That is, in some embodiments, the second conductive feature 122 is electrically connected to the first seal ring structure 115 through the conductive path 95, a second portion 112B of the first conductive feature 112, the gate structure 105 of the transistor 140, the diode 130, and a first portion 112A of the first conductive feature 112. In this case, the first seal ring structure 115 may be referred to as the charge pool which can collect the process charge during fabrication of the second interconnect structure 120 to avoid the PID effect and further protect the gate structure 105 of the transistor 140 from damaging or destroying, thereby maintaining the resistance of the channel 102.

In addition, in the present embodiment, since all gates of all transistors 140 in the IC die 12 are electrically connected together through the first seal ring structure 115 during the fabrication, the diodes 130 plays a key role to avoid the short issue. In detail, during the operation, the diodes 130 may be used as a switch to avoid the gates of the transistors 140 in the semiconductor device array being electrical short through the common seal ring structure 115.

Moreover, the semiconductor device 1 may include a second seal ring structure 125. In some embodiments, the second seal ring structure 125 is located in the seal ring region R2 and embedded in the dielectric layer 124 of the second interconnect structure 120. The second seal ring structure 125 may laterally surround the diode 130 and the transistor 140 in the device region R1 along a closed path from a plan view the device layer 100. Unlike the first seal ring structure 115, the second seal ring structure 125 is electrically floating. That is, the second seal ring structure 125 is electrically isolated from the second conductive feature 122, the diode 130, the transistor 140, and other surrounding devices by the second dielectric layer 124. In contrary, the first seal ring structure 115 may be electrically connected to the diode 130 and the gate structure 105 of the transistor 140.

FIG. 3A to FIG. 3D are cross-sectional views of intermediate stages in the formation of a semiconductor device in accordance with some embodiments.

Figure 3A:
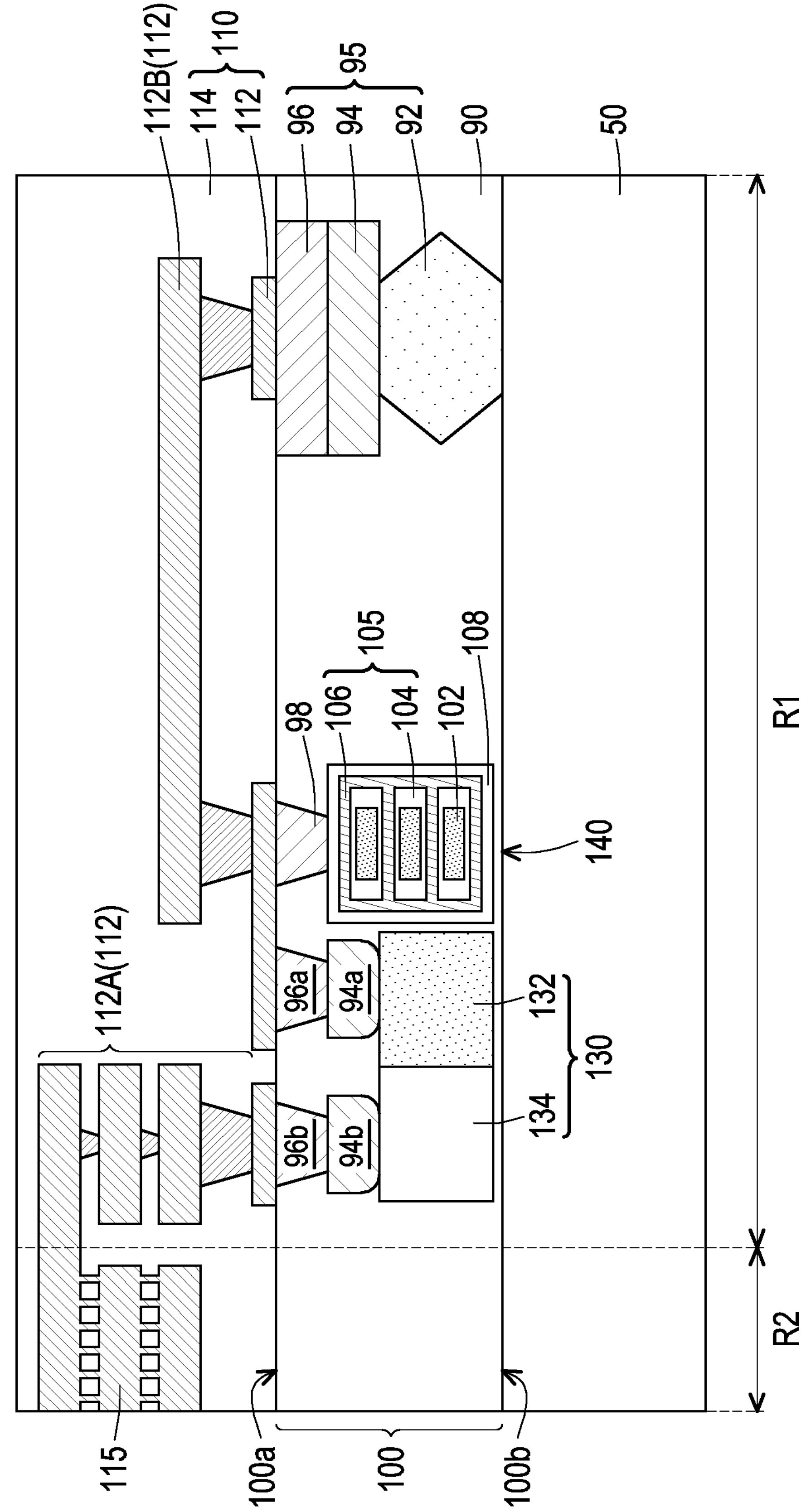
FIG. 3A to FIG. 3D are cross-sectional views of intermediate stages in the formation of a semiconductor device in accordance with some embodiments.

Referring to FIG. 3A, the semiconductor device 1 (FIG. 1) may be formed by following steps. First, a device layer 100 is formed on a substrate 50. In some embodiments, the substrate 50 includes a crystalline silicon substrate (e.g., wafer). The substrate 50 may include various doped regions (e.g., p-type well and/or n-type well) depending on design requirements. In some embodiments, the doped regions may be doped with p-type or n-type dopants. For example, the doped regions may be doped with p-type dopants, such as boron or $BF_2$; n-type dopants, such as phosphorus or arsenic; and/or combinations thereof. The doped regions may be configured for an n-type FinFET, or alternatively, configured for a p-type FinFET. For clarity, the doped regions are not illustrated in FIG. 1 and subsequent drawings. In some alternative embodiments, the substrate 50 includes an element semiconductor such as silicon or germanium, a compound semiconductor such as silicon carbide, gallium arsenic, gallium phosphide, indium phosphide, indium arsenide and indium antimonide, an alloy semiconductor such as SiGe, GaAsP, AlInAs, AlGaAs, GaInAs, GaInP and GaInAsP or combinations thereof.

In some embodiments, the device layer 100 has the frontside 100*a* and the backside 100*b* opposite to each other. Specifically, the diode 130, the transistor 140, and the conductive path 95 may be embedded in the dielectric layer 90 to form the device layer 100. In some embodiments, the diode 130 is a diode with a PN junction, such as a P+/N-well diode, and an N+/P-well diode, an N-well/P-well diode, or one having any other type of junction. The processes of forming the P-well and forming the N-well may include one or more of plasma implantation, diffusion, or epitaxial growth, and providing a semiconductor body with some initial doping type. In some embodiments, the transistor 140 includes the pair of epitaxial source/drain regions (not shown in this cross-sectional view) and the gate structure 105 disposed between the pair of epitaxial source/drain regions. Specifically, the gate structure 105 may include the gate dielectric layer 104 wrapping the nano structures 102 stacked alternately, and the gate electrode 106 formed on the gate dielectric layer 104. In some embodiments, the conductive path 95 may include the MD layer 94 disposed between the epitaxial layer 92 and the VD layer 96. The diode 130, the transistor 140, and the conductive path 95 may be formed by any suitable material and/or method, the disclosure is not limited thereto. In addition, although FIG. 3A illustrates only the diode 130, the transistor 140, and the conductive path 95 embedded in the device layer 100, the present disclosure is not limited thereto. In other embodiments, one or more memory devices, one or more image sensors, one or more passive devices, or the like may also be embedded in the device layer 100.

After forming the device layer 100, the first interconnect structure 110 may be formed on the frontside 100*a* of the device layer 100. The first interconnect structure 110 may include one or more layers of first conductive features 112 formed in one or more stacked first dielectric layers 114. Each of the stacked first dielectric layers 114 may include a dielectric material, such as a low-k dielectric material, an extra low-k (ELK) dielectric material, or the like. The first dielectric layers 114 may be deposited using an appropriate process, such as, CVD, ALD, PVD, PECVD, or the like.

The first conductive features 112 may include conductive lines and conductive vias interconnecting the layers of conductive lines. The conductive vias may extend through respective ones of the first dielectric layers 114 to provide vertical connections between layers of the conductive lines. The first conductive features 112 may be formed through any acceptable process, such as, a damascene process, a dual damascene process, or the like.

In some embodiments, the first conductive features 112 may be formed using a damascene process in which a respective first dielectric layer 124 is patterned utilizing a combination of photolithography and etching techniques to form trenches corresponding to the desired pattern of the first conductive features 112. An optional diffusion barrier and/or optional adhesion layer may be deposited and the trenches may then be filled with a conductive material. Suitable materials for the barrier layer include titanium, titanium nitride, titanium oxide, tantalum, tantalum nitride, titanium oxide, combinations thereof, or the like, and suitable materials for the conductive material include copper, silver, gold, tungsten, aluminum, combinations thereof, or the like. In an embodiment, the first conductive features 112 may be formed by depositing a seed layer of copper or a copper alloy, and filling the trenches by electroplating. A chemical mechanical planarization (CMP) process or the like may be used to remove excess conductive material from a surface of the respective first dielectric layer 124 and to planarize surfaces of the first dielectric layer 124 and the first conductive features 112 for subsequent processing.

In some embodiments, the first seal ring structure 115 is formed in the first dielectric layers 114 at the seal ring region R2. The first seal ring structure 115 may include conductive lines and conductive vias interconnecting the layers of conductive lines. The conductive vias may extend through respective ones of the first dielectric layers 114 to provide vertical connections between layers of the conductive lines. The first seal ring structure 115 may be formed through any acceptable process, such as, a damascene process, a dual damascene process, or the like. It should be noted that, in some embodiments, the first seal ring structure 115 and the first conductive features 112 have the same material (e.g., Cu), and formed in the same step (e.g., damascene process). As such, the first seal ring structure 115 and the first conductive features 112 may be located at the same level. Unlike the conventional sealing ring structure, the first seal ring structure 115 is in (physical) contact with the first conductive features 112, so that the first seal ring structure 115 is electrically connected to the diode 130 in the device layer 100 through the first conductive features 112.

FIG. 3A illustrates four layers of the first conductive features 112 in the first interconnect structure 110. However, it should be appreciated that the first interconnect structure 110 may include any number of the first conductive features 112. The first interconnect structure 110 may be electrically connected to the gate structure 105 of the transistor 140 to form functional circuits. In some embodiments, the functional circuits formed by the first interconnect structure 110 may include logic circuits, memory circuits, image sensor circuits, or the like.

Figure 3B:
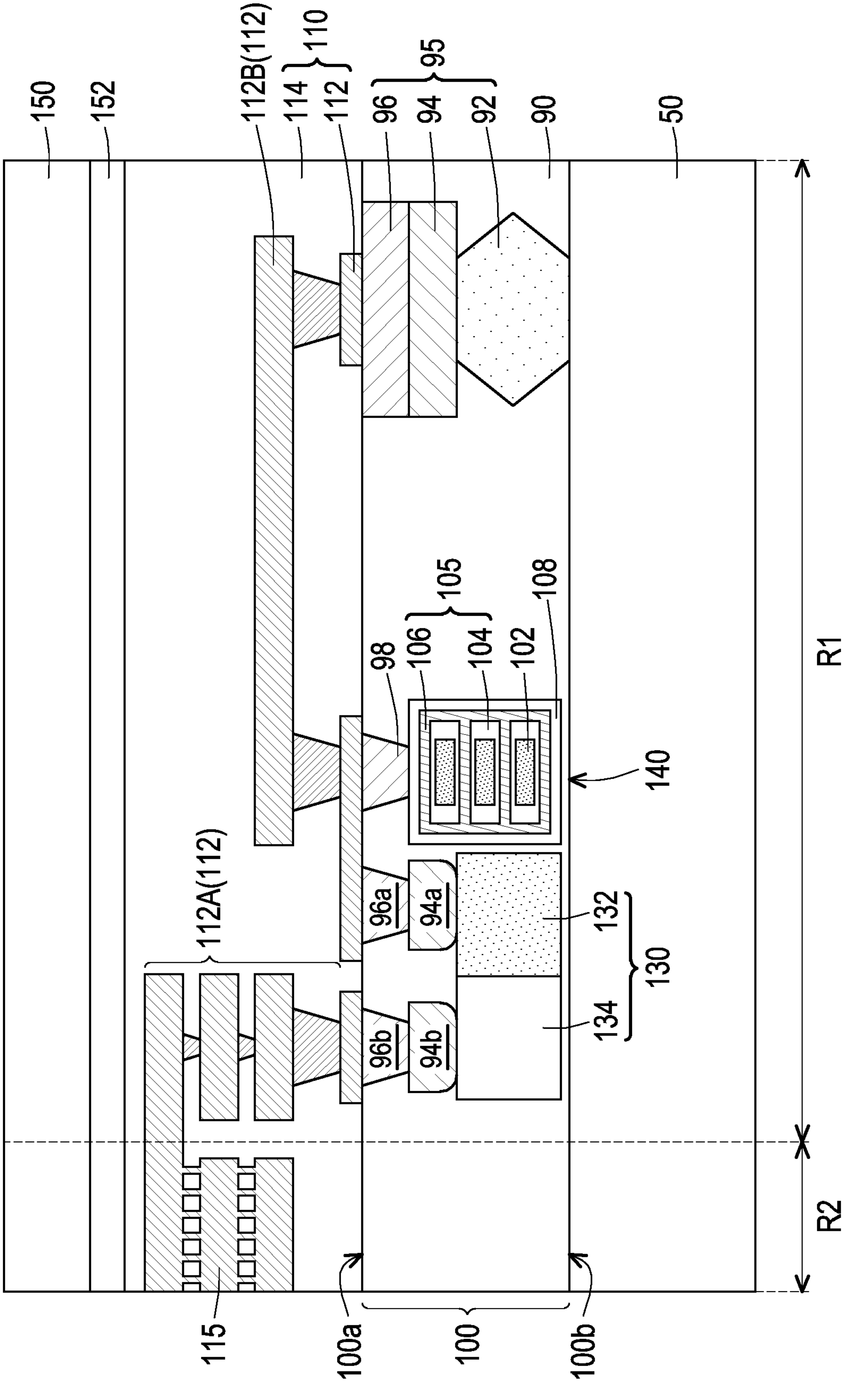

Referring to FIG. 3B, the first interconnect structure 110 is attached to a carrier 150 by a bonding layer 152. The carrier 150 may be a glass carrier substrate, a ceramic carrier substrate, a wafer (e.g., a silicon wafer), or the like. The carrier 150 may provide structural support during subsequent processing steps and in the completed device.

In various embodiments, the carrier 150 may be bonded to the first interconnect structure 110 by using a suitable technique, such as dielectric-to-dielectric bonding, or the like. The dielectric-to-dielectric bonding may include depositing the first bonding material on the first interconnect structure 110. In some embodiments, the first bonding material comprises silicon oxide (e.g., a high-density plasma (HDP) oxide, or the like) that is deposited by CVD, ALD, PVD, or the like. The second bonding material may likewise be an oxide layer that is formed on a surface of the carrier 150 prior to bonding using, for example, CVD, ALD, PVD, thermal oxidation, or the like. Other suitable materials may be used for the first bonding material and the second bonding material. Before the carrier 150 is bonded to the first interconnect structure 110, the carrier 150 and the first interconnect structure 110 are aligned with each other. The first bonding material is in contact with the second bonding material to from the bonding layer 152 by the application of pressure and heat, and then the carrier 150 and the first interconnect structure 110 are bonded together by the bonding layer 152.

Figure 3C:
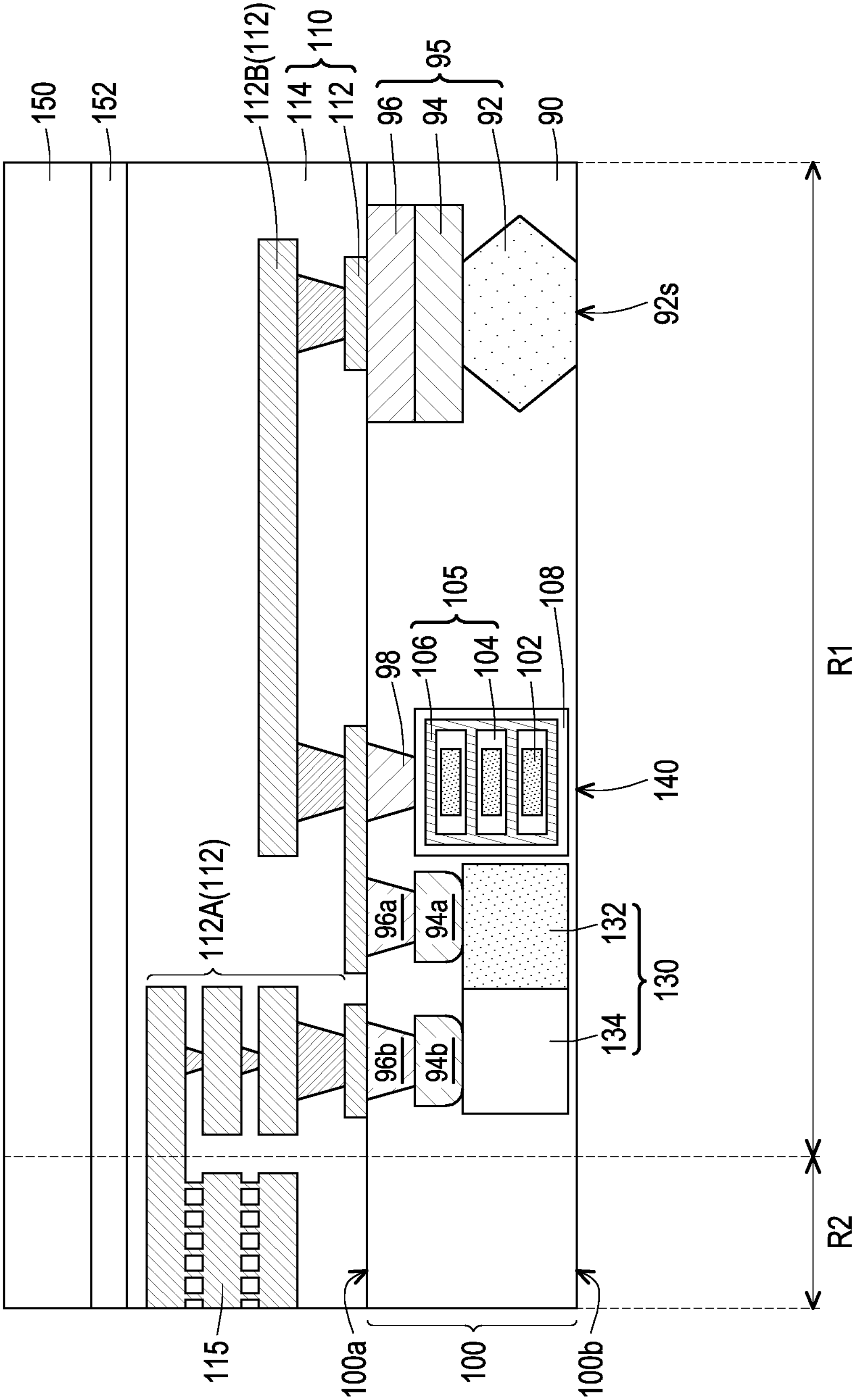

Referring to FIG. 3C, after the attaching, the substrate 50 is removed to expose the backside 100*b* of the device layer 100. Specifically, a thinning process may be applied to the substrate 50. The thinning process may include a planarization process (e.g., a CMP), an etch-back process, a combination thereof, or the like. The thinning process may expose a surface 92*s* of the epitaxial layer 92 opposite the first interconnect structure 110, while the diode 130 and the gate structure 105 are covered by the dielectric layer 90.

Figure 3D:
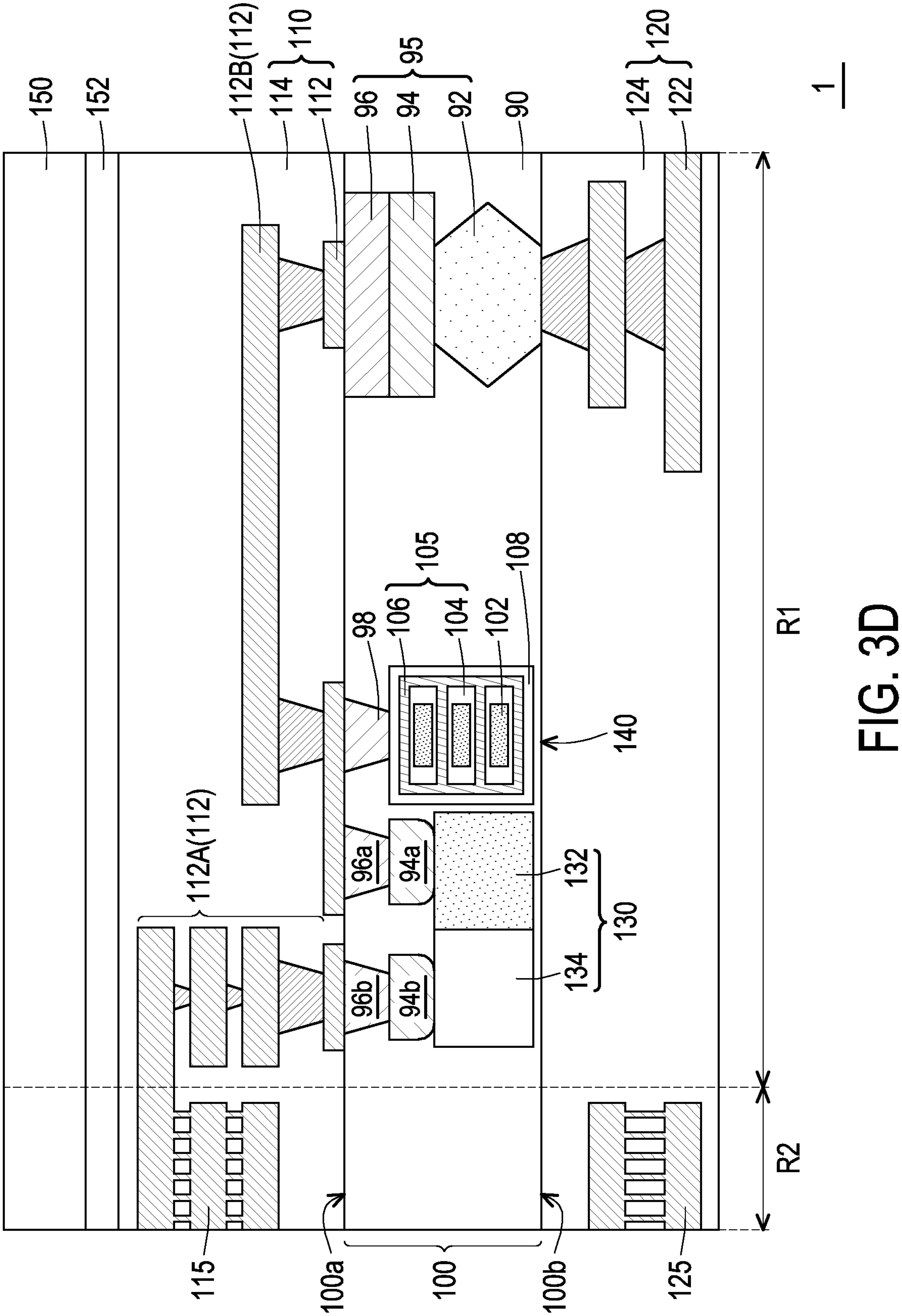

Referring to FIG. 3D, the second interconnect structure 120 is formed on the backside 100*b* of the device layer 100, thereby accomplishing the semiconductor device 1. The second interconnect structure 120 may include one or more layers of second conductive features 122 formed in one or more stacked second dielectric layers 124. The second conductive features 122 may include conductive lines and conductive vias interconnecting the layers of conductive lines. The conductive vias may extend through respective ones of the second dielectric layers 124 to provide vertical connections between layers of the conductive lines. The materials, forming method, and configuration of the second conductive features 122 and the second dielectric layers 124 are similar to those of the first conductive features 112 and the first dielectric layers 114, and thus the details are omitted herein. Although FIG. 3D illustrates two layers of the second conductive features 122 in the second dielectric layers 124, it should be appreciated that the second interconnect structure 120 may include any number of the second conductive features 122.

In some embodiments, the second seal ring structure 125 is formed in the second dielectric layers 124 at the seal ring region R2. The second seal ring structure 125 may include conductive lines and conductive vias interconnecting the layers of conductive lines. The conductive vias may extend through respective ones of the second dielectric layers 124 to provide vertical connections between layers of the conductive lines. The second seal ring structure 125 may be formed through any acceptable process, such as, a damascene process, a dual damascene process, or the like. It should be noted that, in some embodiments, the second seal ring structure 125 and the second conductive features 122 have the same material (e.g., Cu), and formed in the same step (e.g., damascene process). As such, the second seal ring structure 125 and the second conductive features 122 may be located at the same level. Unlike the first seal ring structure 115, the second seal ring structure 125 is electrically floating. That is, the second seal ring structure 125 is electrically isolated from the second conductive feature 122, the diode 130, the transistor 140, and other surrounding devices by the second dielectric layer 124. In contrary, the first seal ring structure 115 may be electrically connected to the diode 130 and the gate structure 105 of the transistor 140.

It should be noted that, in the present embodiment, the second conductive feature 122 is electrically connected to the first seal ring structure 115 through the conductive path 95, a second portion 112B of the first conductive feature 112, the gate structure 105 of the transistor 140, the diode 130, and a first portion 112A of the first conductive feature 112. In this case, the process charge that is produced during fabrication of the second interconnect structure 120 can be released to the first seal ring structure 115. In some embodiments, the fabrication of the second interconnect structure 120 includes performing a plasma process. For example, the second dielectric layer 124 may be deposited by using a plasma deposition process, and the second conductive feature 122 may be patterned by using a plasma etching process. The process charge used in the plasma process may be electrically connected or released to the first seal ring structure 115 through the conductive path 95, a second portion 112B of the first conductive feature 112, the gate structure 105 of the transistor 140, the diode 130, and a first portion 112A of the first conductive feature 112. That is, the first seal ring structure 115 may be referred to as the charge pool which can collect the process charge during fabrication of the second interconnect structure 120 to avoid the PID effect and further protect the gate structure 105 of the transistor 140 from damaging or destroying, thereby maintaining the resistance of the channel 102.

Figure 4:
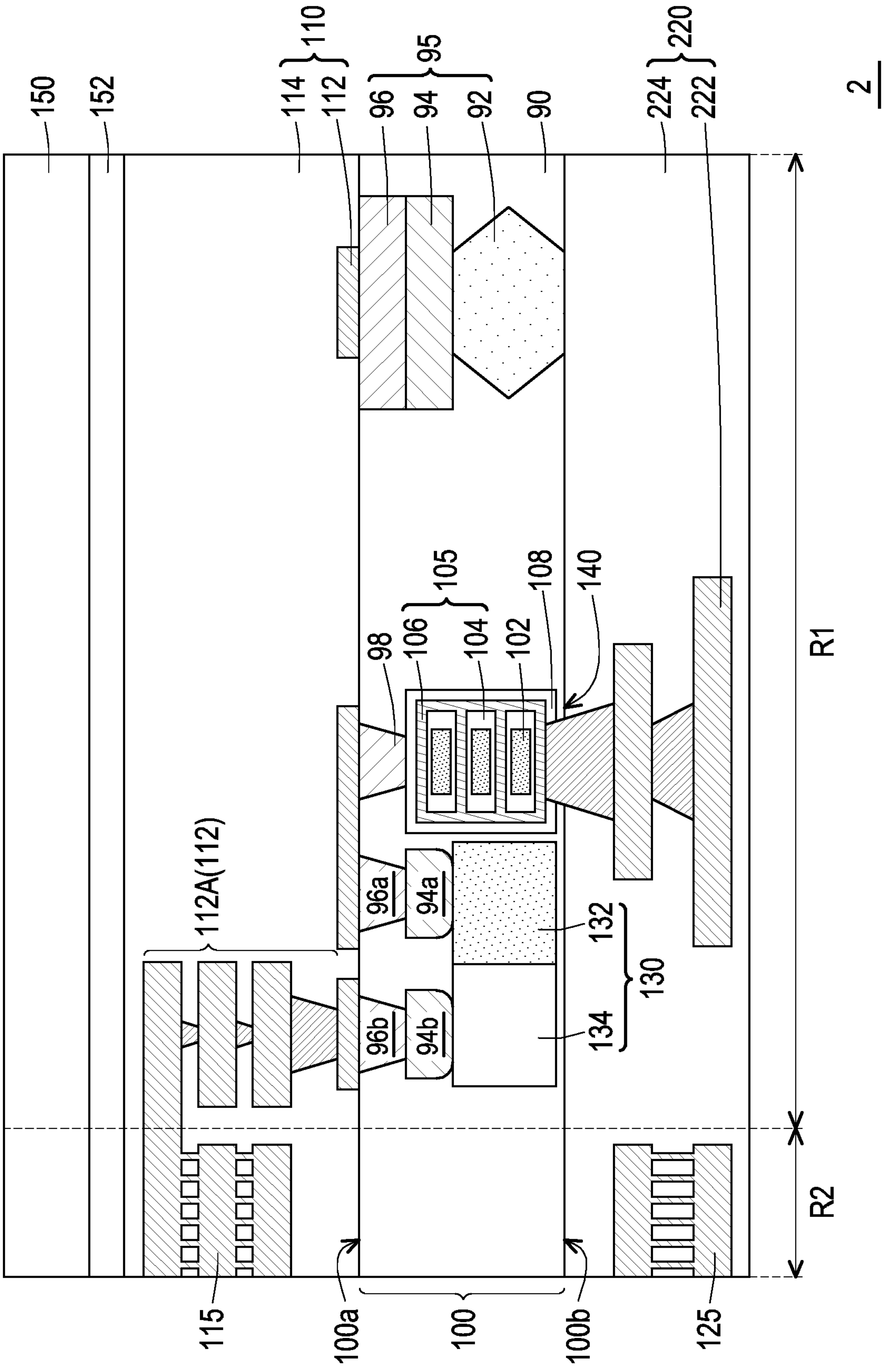
FIG. 4 is a cross-sectional view showing a semiconductor device in accordance with some alternative embodiments.

FIG. 4 is a cross-sectional view showing a semiconductor device in accordance with some alternative embodiments.

FIG. 4 illustrates a semiconductor device 2 similar to the semiconductor device 1 of FIG. 1, but the second conductive feature 222 is in contact with the gate structure 105 of the transistor 140. Specifically, the second interconnect structure 220 may have the routing different from that of the second interconnect structure 120. In some embodiments, the second conductive feature 222 embedded in the second dielectric layer 224 is in direct contact with the gate structure 105 of the transistor 140 at the backside 100*b* of the device layer 100. In this case, the gate voltage is applied to the gate structure 105 of the transistor 140 through the second (i.e., backside) interconnect structure 220 without through the routing from the first (i.e., frontside) interconnect structure 110. That is, the routing of the voltage supply can be adjusted according to the design requirements.

According to some embodiments, a semiconductor device includes: a device layer having a frontside and a backside; a first interconnect structure disposed on the frontside of the device layer, and having a first seal ring structure; a second interconnect structure disposed on the backside of the device layer; and a diode and a transistor embedded in the device layer, wherein a gate of the transistor is electrically connected to the first seal ring structure by the diode.

In some embodiments, the diode comprises a first doped region with a first conductivity type and a second doped region with a second conductivity type connected to each other. In some embodiments, the first conductivity type is different from the second conductivity type. In some embodiments, the semiconductor device includes a first region and a second region laterally surrounding the first region, the transistor is located in the first region, and the first seal ring structure is located in the second region to laterally surround the transistor. In some embodiments, the first interconnect structure includes: a first dielectric layer and a first conductive feature embedded in the first dielectric layer, and the diode is electrically connected to the first seal ring structure by a first portion of the first conductive feature. In some embodiments, the second interconnect structure includes: a second dielectric layer and a second conductive feature embedded in the second dielectric layer, and the second conductive feature is contact with the gate of the transistor. In some embodiments, the semiconductor device further includes a second seal ring structure embedded in the second dielectric layer, wherein the second seal ring structure is electrically isolated from the second conductive feature by the second dielectric layer. In some embodiments, the first interconnect structure includes: a first dielectric layer and a first conductive feature embedded in the first dielectric layer; the second interconnect structure includes: a second dielectric layer and a second conductive feature embedded in the second dielectric layer, and the device layer further includes a conductive path extending from the frontside of the device layer to the backside of the device layer. In some embodiments, the second conductive feature is electrically connected to the first seal ring structure through the conductive path, a second portion of the first conductive feature, the gate of the transistor, the diode, and a first portion of the first conductive feature.

According to some embodiments, a method of forming a semiconductor device includes: forming a device layer having a frontside and a backside on a substrate, wherein a diode and a transistor are embedded in the device layer; forming a first interconnect structure on the frontside of the device layer, wherein the first interconnect structure has a first seal ring structure, and a gate of the transistor is electrically connected to the first seal ring structure by the diode; attaching the first interconnect structure to a carrier; after the attaching, removing the substrate to expose the backside of the device layer; and forming a second interconnect structure on the backside of the device layer.

In some embodiments, the first interconnect structure includes: a first dielectric layer and a first conductive feature formed in the first dielectric layer, and the diode is electrically connected to the first seal ring structure by a first portion of the first conductive feature. In some embodiments, the second interconnect structure includes: a second dielectric layer and a second conductive feature formed in the second dielectric layer, and the second conductive feature is contact with the gate of the transistor. In some embodiments, the method further includes: forming a second seal ring structure in the second dielectric layer, wherein the second seal ring structure is electrically isolated from the second conductive feature by the second dielectric layer. In some embodiments, the first interconnect structure includes: a first dielectric layer and a first conductive feature formed in the first dielectric layer; the second interconnect structure includes: a second dielectric layer and a second conductive feature formed in the second dielectric layer, and the device layer further includes a conductive path extending from the frontside of the device layer to the backside of the device layer. In some embodiments, the forming the second interconnect structure comprises performing a plasma process, a process charge used in the plasma process is electrically connected to the first seal ring structure through the conductive path, a second portion of the first conductive feature, the gate of the transistor, the diode, and a first portion of the first conductive feature. In some embodiments, the plasma process includes a plasma etching process, a plasma deposition process, or a combination thereof.

According to some embodiments, a semiconductor device includes: a device layer; a diode and a transistor embedded in the device layer, wherein a gate of the transistor is electrically connected to a charge pool by the diode, and the charge pool surrounds the transistor along a closed path from a plan view of the device layer.

In some embodiments, the semiconductor device further includes: a first interconnect structure disposed on the frontside of the device layer, wherein the charge pool is embedded in the first interconnect structure; and a second interconnect structure disposed on the backside of the device layer opposite to the frontside of the device. In some embodiments, the first interconnect structure includes: a first dielectric layer and a first conductive feature embedded in the first dielectric layer; the second interconnect structure includes: a second dielectric layer and a second conductive feature embedded in the second dielectric layer, and the device layer further includes a conductive path extending from the frontside of the device layer to the backside of the device layer, the second conductive feature is electrically connected to the charge pool through the conductive path, a second portion of the first conductive feature, the gate of the transistor, the diode, and a first portion of the first conductive feature. In some embodiments, the charge pool and the first conductive feature have the same material and formed in the same step.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

a device layer having a frontside and a backside;

a first interconnect structure disposed on the frontside of the device layer, and having a first seal ring structure;

a second interconnect structure disposed on the backside of the device layer; and a diode and a transistor embedded in the device layer, wherein a gate of the transistor is electrically connected to the first seal ring structure by the diode.

2. The semiconductor device of claim 1, wherein the diode comprises a first doped region with a first conductivity type and a second doped region with a second conductivity type connected to each other.

3. The semiconductor device of claim 2, wherein the first conductivity type is different from the second conductivity type.

4. The semiconductor device of claim 1, wherein the semiconductor device comprises a first region and a second region laterally surrounding the first region, the transistor is located in the first region, and the first seal ring structure is located in the second region to laterally surround the transistor.

5. The semiconductor device of claim 1, wherein the first interconnect structure includes: a first dielectric layer and a first conductive feature embedded in the first dielectric layer, and the diode is electrically connected to the first seal ring structure by a first portion of the first conductive feature.

6. The semiconductor device of claim 1, wherein the second interconnect structure includes: a second dielectric layer and a second conductive feature embedded in the second dielectric layer, and the second conductive feature is contact with the gate of the transistor.

7. The semiconductor device of claim 6, further comprising a second seal ring structure embedded in the second dielectric layer, wherein the second seal ring structure is electrically isolated from the second conductive feature by the second dielectric layer.

8. The semiconductor device of claim 1, wherein:

the first interconnect structure includes: a first dielectric layer and a first conductive feature embedded in the first dielectric layer;

the second interconnect structure includes: a second dielectric layer and a second conductive feature embedded in the second dielectric layer, and the device layer further includes a conductive path extending from the frontside of the device layer to the backside of the device layer.

9. The semiconductor device of claim 8, wherein the second conductive feature is electrically connected to the first seal ring structure through the conductive path, a second portion of the first conductive feature, the gate of the transistor, the diode, and a first portion of the first conductive feature.

10. A method of forming a semiconductor device, comprising:

forming a device layer having a frontside and a backside on a substrate, wherein a diode and a transistor are embedded in the device layer;

forming a first interconnect structure on the frontside of the device layer, wherein the first interconnect structure has a first seal ring structure, and a gate of the transistor is electrically connected to the first seal ring structure by the diode;

attaching the first interconnect structure to a carrier;

after the attaching, removing the substrate to expose the backside of the device layer; and forming a second interconnect structure on the backside of the device layer.

11. The method of claim 10, wherein the first interconnect structure includes: a first dielectric layer and a first conductive feature formed in the first dielectric layer, and the diode is electrically connected to the first seal ring structure by a first portion of the first conductive feature.

12. The method of claim 10, wherein the second interconnect structure includes: a second dielectric layer and a second conductive feature formed in the second dielectric layer, and the second conductive feature is contact with the gate of the transistor.

13. The method of claim 12, further comprising: forming a second seal ring structure in the second dielectric layer, wherein the second seal ring structure is electrically isolated from the second conductive feature by the second dielectric layer.

14. The method of claim 10, wherein:

the first interconnect structure includes: a first dielectric layer and a first conductive feature formed in the first dielectric layer;

the second interconnect structure includes: a second dielectric layer and a second conductive feature formed in the second dielectric layer, and the device layer further includes a conductive path extending from the frontside of the device layer to the backside of the device layer.

15. The method of claim 14, wherein the forming the second interconnect structure comprises performing a plasma process, a process charge used in the plasma process is electrically connected to the first seal ring structure through the conductive path, a second portion of the first conductive feature, the gate of the transistor, the diode, and a first portion of the first conductive feature.

16. The method of claim 15, wherein the plasma process comprises a plasma etching process, a plasma deposition process, or a combination thereof.

17. A semiconductor device, comprising:

a device layer;

a diode and a transistor embedded in the device layer, wherein a gate of the transistor is electrically connected to a charge pool by the diode, and the charge pool surrounds the transistor along a closed path from a plan view of the device layer.

18. The semiconductor device of claim 17, further comprising:

a first interconnect structure disposed on the frontside of the device layer, wherein the charge pool is embedded in the first interconnect structure; and a second interconnect structure disposed on the backside of the device layer opposite to the frontside of the device.

19. The semiconductor device of claim 18, wherein the first interconnect structure includes: a first dielectric layer and a first conductive feature embedded in the first dielectric layer;

the second interconnect structure includes: a second dielectric layer and a second conductive feature embedded in the second dielectric layer, and the device layer further includes a conductive path extending from the frontside of the device layer to the backside of the device layer, the second conductive feature is electrically connected to the charge pool through the conductive path, a second portion of the first conductive feature, the gate of the transistor, the diode, and a first portion of the first conductive feature.

20. The semiconductor device of claim 19, wherein the charge pool and the first conductive feature have the same material and formed in the same step.

* * * * *